United States Patent
Ishikawa et al.

(10) Patent No.: US 6,781,228 B2
(45) Date of Patent: Aug. 24, 2004

(54) DONUT POWER MESH SCHEME FOR FLIP CHIP PACKAGE

(75) Inventors: Hiroshi Ishikawa, Los Gatos, CA (US); Thomas Antisseril, Newark, CA (US); Radoslav Ratchkov, Santa Clara, CA (US); Bo Shen, Fremont, CA (US); Prasad Subbarao, San Jose, CA (US); Maad Al-Dabagh, San Jose, CA (US); Anwar Ali, San Jose, CA (US); Benjamin Mbouombouo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/339,844

(22) Filed: Jan. 10, 2003

(65) Prior Publication Data

US 2004/0135263 A1 Jul. 15, 2004

(51) Int. Cl.[7] .................. H01L 23/52; H01L 23/48; H01L 23/053; H01L 23/12; H01L 29/40
(52) U.S. Cl. .................. 257/692; 257/691; 257/700; 257/758; 257/778
(58) Field of Search .................. 257/691, 692, 257/698, 700, 758, 759, 778

(56) References Cited

U.S. PATENT DOCUMENTS

| | | | | |
|---|---|---|---|---|
| 5,272,600 A | * | 12/1993 | Carey | 361/792 |
| 5,311,058 A | | 5/1994 | Smolley | |
| 6,121,679 A | * | 9/2000 | Luvara et al. | 257/700 |
| 6,180,998 B1 | * | 1/2001 | Crafts | 257/659 |
| 6,194,768 B1 | | 2/2001 | Gardner et al. | |
| 6,331,733 B1 | * | 12/2001 | Or-Bach et al. | 257/758 |
| 6,437,431 B1 | * | 8/2002 | Mbouombouo et al. | 257/676 |
| 6,476,493 B2 | * | 11/2002 | Or-Bach et al. | 257/758 |
| 6,476,497 B1 | | 11/2002 | Waldron | |

* cited by examiner

Primary Examiner—Nathan J. Flynn
Assistant Examiner—Victor A. Mandala, Jr.
(74) Attorney, Agent, or Firm—Trexler, Bushnell, Giangiorgi & Blackstone, LTD

(57) ABSTRACT

A multiple layer mesh design which includes a layer which provides a vertical mesh and an adjacent layer which provides a horizontal mesh which includes an open area or hole. The layer which provides the horizontal mesh (with hole) may either be above or below the vertical mesh layer, depending on the design. The vertical mesh may be full or may surround an open area or hole where the design includes both a horizontal donut mesh and a vertical donut mesh.

19 Claims, 3 Drawing Sheets

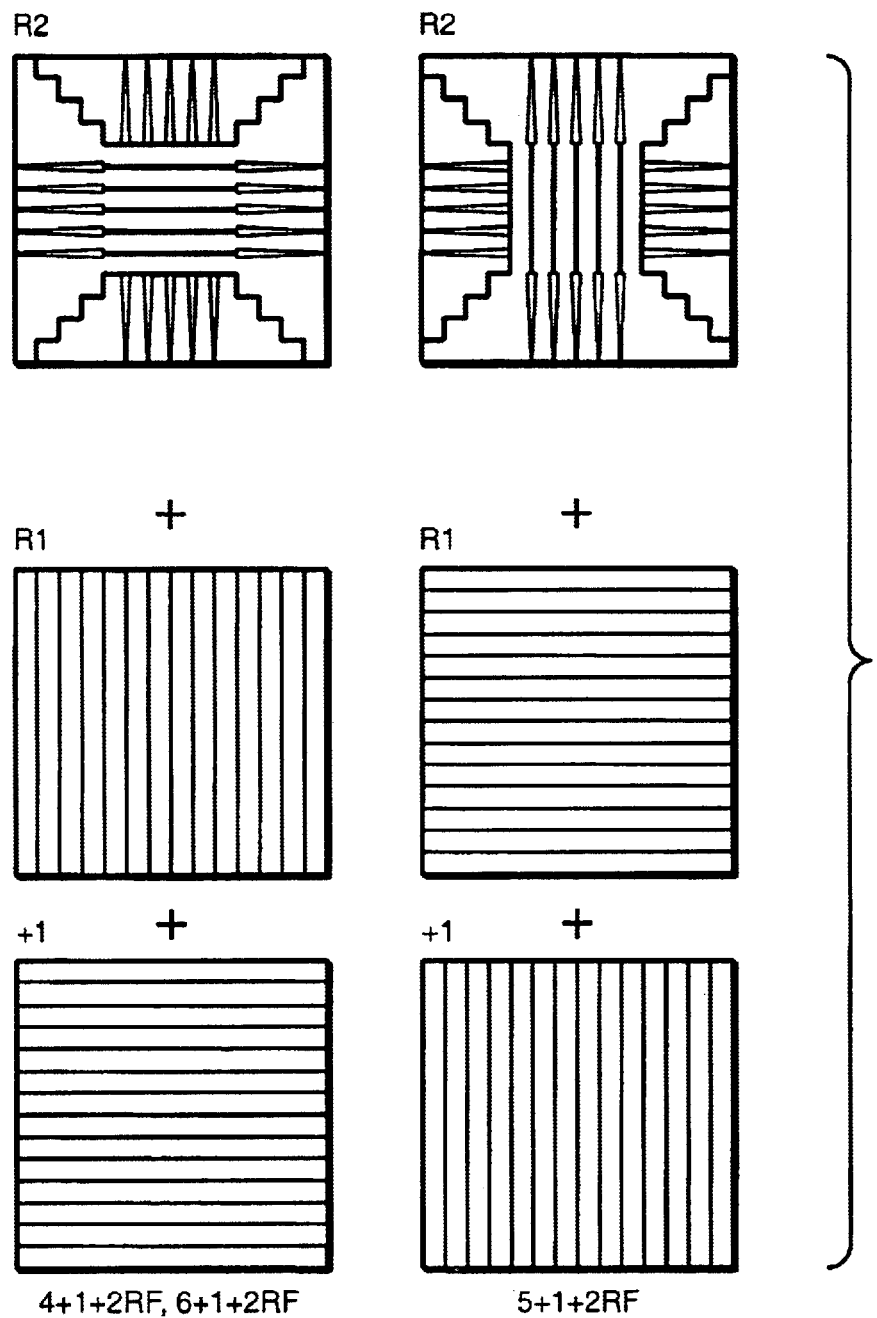
FIG._1

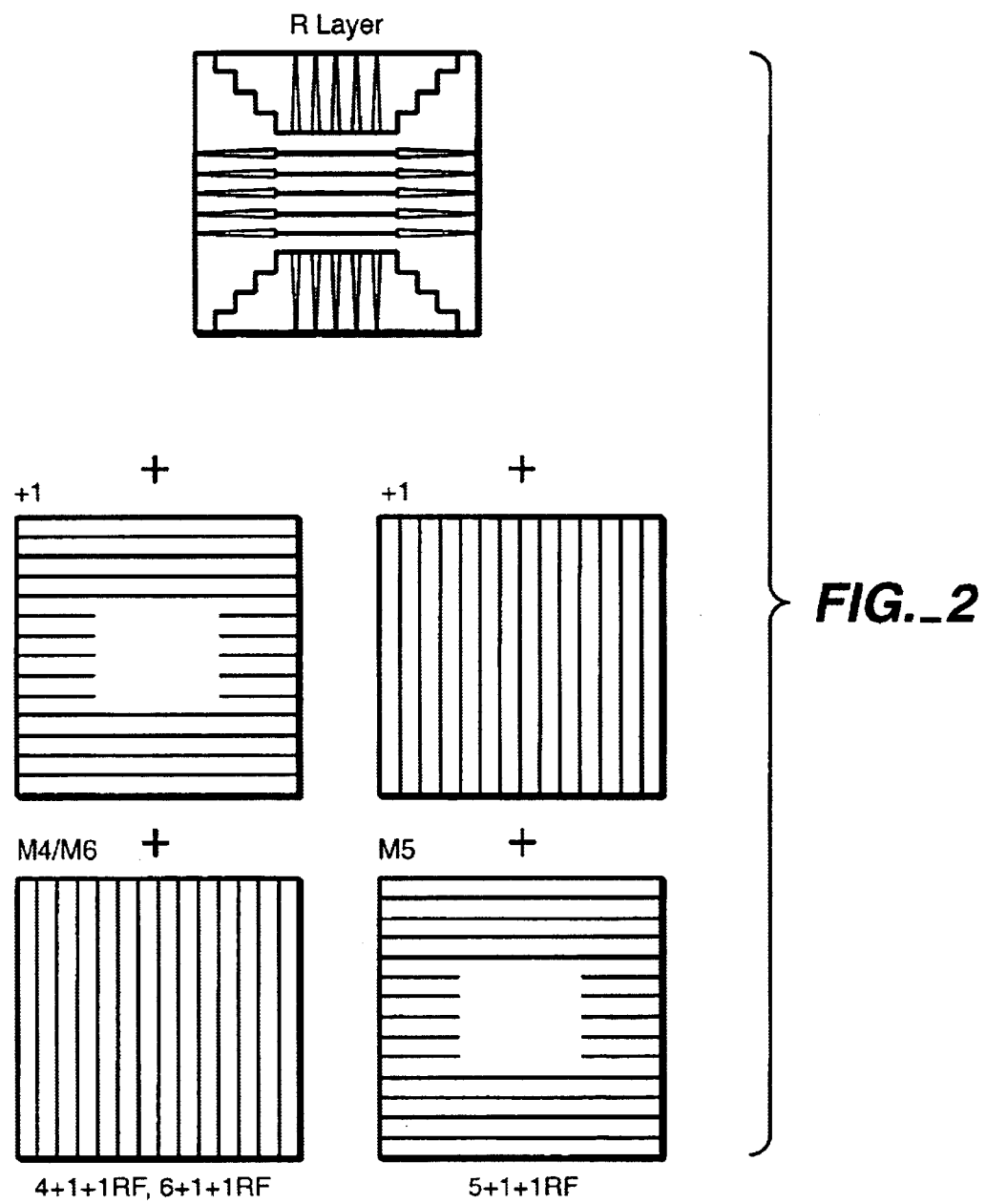
FIG._2

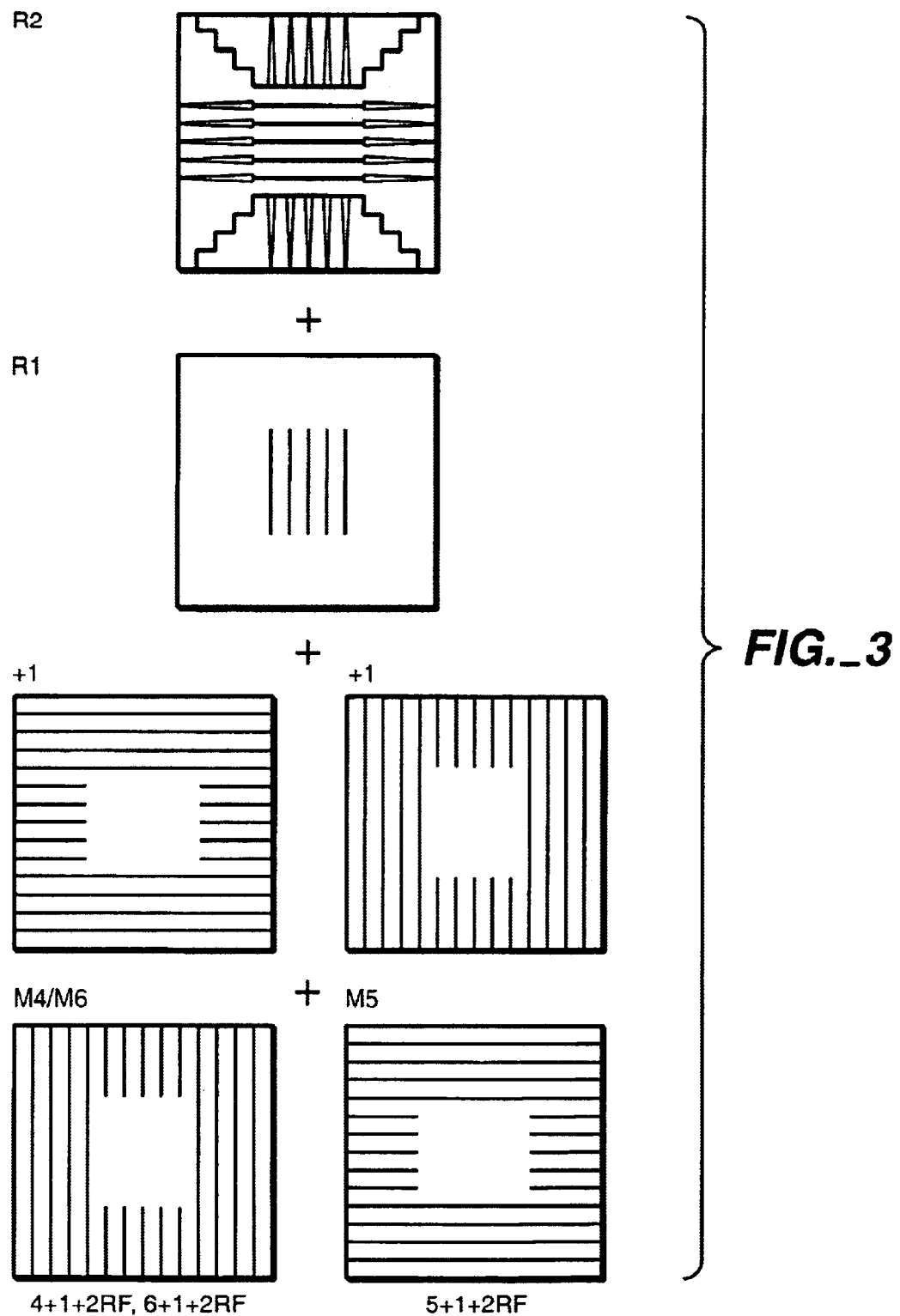
FIG._3

DONUT POWER MESH SCHEME FOR FLIP CHIP PACKAGE

BACKGROUND

The present invention generally relates to power mesh schemes for flip chip packages, and more specifically relates to a power mesh scheme which incorporates a donut mesh structure.

In Flip Chip packages, often a center region is covered by very strong power meshes. With such a structure, often voltage drops around the corners and edges of the die are too great. Voltage drops cause decreased performance of the chip. Hence, it is advantageous to design a chip such that voltage drops are not too great.

In an attempt to solve the problem, present flip chip power mesh schemes are being designed such that full horizontal and vertical meshes are filled on redistribution layers, i.e., on the R-1 and R-2 layers. This type of arrangement is shown in FIG. 1. Such an arrangement keeps voltage drops reasonable, but such an arrangement results in many routing resources being used for constructing the power meshes. In FIG. 1, "4+1+2RF" refers to a multiple layer design which includes four thin layers, one thicker layer, and two very thick, distribution layers (R1 and R2). Likewise, "6+1+2RF" refers to a design which includes six thin layers, one thicker layer, and two very thick, distribution layers, and "5+1+2RF" refers to a multiple layer design which includes five thin layers, one thicker layer, and two very thick, distribution layers (where "F" refers to Flip Chip in each instance).

The present invention is directed at saving power routing resources without reducing power performance of the chip.

OBJECTS AND SUMMARY

A general object of an embodiment of the present invention is to provide a multiple layer mesh design which includes a donut mesh.

Briefly, and in accordance with at least one of the foregoing objects, an embodiment of the present invention provides a multiple layer mesh design which includes a layer which provides a vertical mesh and an adjacent layer which provides a horizontal mesh which generally surrounds an open area or hole.

The layer which provides the horizontal mesh (with hole) may either be above or below the vertical mesh layer, depending on the design. For example, in a stack having an even number of routing layers, the vertical mesh will be on the top layer and the horizontal mesh (with hole) will be on the next layer going down. In a stack having an odd number of routing layers, the horizontal mesh (with hole) will be on the top layer and the vertical mesh will be on the next layer going down. For example, in a five metal layer design (i.e., a design with four thin layers, a thicker layer and a very thick layer, e.g., a redistribution layer), the layer with the horizontal mesh (and hole) is preferably on m5 and the vertical mesh is on m4.

The vertical mesh may be full or may also be a donut mesh. Providing a full vertical mesh guarantees a cross to an m1 power rail at each 200 micrometers. The donut mesh, i.e., layer with horizontal mesh surrounding a hole, supplies power around the edges of a die, and routing resources of the center region (i.e., proximate the hole) are saved.

Preferably, a scheme which includes a vertical donut mesh is used in designs with two R layers, where the upper R is used exclusively by Flip Chip, and the lower R is available in the center, and only the periphery is used by Flip Chip. In such case, preferably holes or open areas are provided in both meshes, and the lower R includes a vertical mesh at its center. Hence, donut meshes exist on "+1" (the thick layer) and the top-most thin layer, and the R1 layer has a vertical mesh in the center region.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 schematically illustrates a prior art multiple layer mesh design, where the design includes a full horizontal mesh;

FIG. 2 schematically illustrates a multiple layer mesh design which is in accordance with an embodiment of the present invention, where the design includes a horizontal mesh surrounding a hole (i.e., a donut configuration); and FIG. 3 schematically illustrates a multiple layer mesh design which is in accordance with another embodiment of the present invention, where the design includes both a horizontal and vertical mesh which include holes (i.e., a donut configuration).

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 2 illustrates a multiple layer power mesh design which provides that the layer which provides the horizontal mesh includes a hole or open space in the middle. Hence, the horizontal mesh is a donut configuration. Preferably, an adjacent layer provides a full vertical mesh.

The layer which provides the horizontal mesh (with hole) may either be above or below the vertical mesh layer, depending on the design. For example, in a stack having an even number of routing layers, the vertical mesh will be on the top layer and the horizontal mesh (with hole) will be on the next layer going down. This is what is shown on the left-hand side of FIG. 2. In a stack having an odd number of routing layers, the horizontal mesh (with hole) will be on the top layer and the vertical mesh will be on the next layer going down. This is what is shown on the right-hand side of FIG. 2. For example, in a five metal layer design (i.e., 4+1+1RF layer stack, a design with four thin layers, a thicker layer and a very thick layer, e.g., a redistribution layer), the horizontal mesh (and hole) is on m5 layer and the vertical mesh is preferably on m4.

As shown in FIG. 2, preferably the vertical mesh is full. Providing a full vertical mesh guarantees a cross to an m1 power rail at each 200 micrometers. The donut mesh, i.e., layer with horizontal mesh surrounding a hole, supplies power around the edges of a die, and routing resources of the center region (i.e., proximate the hole) are saved, and can be used for clock.

Another embodiment of the present invention is illustrated in FIG. 3. As shown, the design includes not only a layer with a horizontal mesh having a hole or open area in the center, but also a layer with a vertical mesh having a hole or open area in the center. In other words, the design includes both a horizontal donut mesh and a vertical donut mesh. The scheme is used in designs with two R layers, where the upper R is used exclusively by Flip Chip, and the lower R is available in the center, and only the periphery is used by Flip Chip. As shown, there are holes or open areas in both meshes, and the lower R includes a vertical mesh at its center. Hence, donut meshes exist on "+1" (the thick layer) and the top-most thin layer, and the R1 layer has a vertical mesh in the center region. This structure can maintain power performance, and reduce the amount of routing resources which are used for power meshes.

The vertical mesh on R1 and the vertical donut mesh guarantee cross to M1 power rail at each 200 micrometers. Since M1 is guaranteed to be cut by the vertical meshes at each 200 micrometers, the same number of vias needs to be dropped at each crossing point between the vertical mesh and the M1 power rail. The horizontal donut mesh supplies power around the edges of a die, and routing resources of the center region can be saved, and can be used for clock and regular routings.

While an embodiment of the present invention is shown and described, it is envisioned that those skilled in the art may devise various modifications of the present invention without departing from the spirit and scope of the appended claims.

What is claimed is:

1. A multiple layer mesh design comprising a layer having a vertical mesh; a layer having a horizontal mesh, said horizontal mesh surrounding an open area, said layer having the vertical mesh being disposed adjacent to the layer having the horizontal mesh surrounding the open area, said horizontal mesh comprising continuous horizontal lines but for the open area, said vertical mesh comprising vertical continuous lines, said horizontal mesh comprising horizontal lines which end at said open area and are non-terminal on any of said vertical lines, said vertical mesh comprising a plurality of vertical lines which traverse said open area and are non-terminating with regard to said horizontal lines.

2. A multiple layer mesh design as recited in claim 1, wherein the open area is generally in the middle of the layer.

3. A multiple layer mesh design as recited in claim 1, wherein the vertical mesh is a full vertical mesh.

4. A multiple layer mesh design as recited in claim 1, wherein the vertical mesh also surrounds an open area.

5. A multiple layer mesh design as recited in claim 1, wherein the multiple layer mesh design comprises an even number of routing layers and said layer having the vertical mesh is on the top layer.

6. A multiple layer mesh design as recited in claim 5, wherein the layer having the horizontal mesh surrounding the open area is on the next layer going down relative to said layer having the vertical mesh.

7. A multiple layer mesh design as recited in claim 1, wherein the multiple layer mesh design comprises an odd number of routing layers and said layer having the horizontal mesh surrounding the open area is on the top layer.

8. A multiple layer mesh design as recited in claim 7, wherein the layer having the vertical mesh is on the next layer going down relative to said layer having the horizontal mesh surrounding the open area.

9. A multiple layer mesh design as recited in claim 4, further comprising a layer which includes a vertical mesh at its center.

10. A multiple layer mesh design as recited in claim 9, wherein the layer which includes a vertical mesh at its center is below the layers with the vertical and horizontal mesh which surround an open area.

11. A multiple layer mesh design comprising a layer having a vertical mesh; a layer having a horizontal mesh with an open area generally in the middle, said layer having the vertical mesh being disposed adjacent to the layer having the horizontal mesh with the open area, said horizontal mesh comprising continuous horizontal lines but for the open area, said vertical mesh comprising vertical continuous lines, said horizontal mesh comprising horizontal lines which end at said open area and are non-terminal on any of said vertical lines, said vertical mesh comprising a plurality of vertical lines which traverse said open area and are non-terminating with regard to said horizontal lines.

12. A multiple layer mesh design as recited in claim 11, wherein the vertical mesh is a full vertical mesh.

13. A multiple layer mesh design as recited in claim 11, wherein the vertical mesh also surrounds an open area.

14. A multiple layer mesh design as recited in claim 11, wherein the multiple layer mesh design comprises an even number of routing layers and said layer having the vertical mesh is on the top layer.

15. A multiple layer mesh design as recited in claim 14, wherein the layer having the horizontal mesh with the open area is on the next layer going down relative to said layer having the vertical mesh.

16. A multiple layer mesh design as recited in claim 11, wherein the multiple layer mesh design comprises an odd number of routing layers and said layer having the horizontal mesh with the open area is on the top layer.

17. A multiple layer mesh design as recited in claim 16, wherein the layer having the vertical mesh is on the next layer going down relative to said layer having the horizontal mesh with the open area.

18. A multiple layer mesh design as recited in claim 13, further comprising a layer which includes a vertical mesh at its center.

19. A multiple layer mesh design as recited in claim 18, wherein the layer which includes a vertical mesh at its center is below the layers with the vertical and horizontal meshes which surround an open area.

* * * * *